United States Patent [19]

Mooradian

[11] Patent Number: 5,172,390
[45] Date of Patent: Dec. 15, 1992

[54] PRE-ALIGNED DIODE LASER FOR EXTERNAL CAVITY OPERATION

[75] Inventor: Aram Mooradian, Winchester, Mass.

[73] Assignee: Massachusetts Institute of Technology, Cambridge, Mass.

[21] Appl. No.: 757,182

[22] Filed: Sep. 10, 1991

Related U.S. Application Data

[63] Continuation-in-part of Ser. No. 712,185, Jun. 7, 1991, which is a continuation of Ser. No. 341,028, Apr. 20, 1989, Pat. No. 5,050,179.

[51] Int. Cl.$^5$ .............................................. H01S 3/08
[52] U.S. Cl. ......................................... 372/92; 372/44
[58] Field of Search ................................... 372/92, 44

[56] References Cited

U.S. PATENT DOCUMENTS

| 4,485,474 | 11/1984 | Osterwalder | 372/44 |
| 4,756,003 | 7/1988 | Baer et al. | |
| 4,803,686 | 2/1989 | Brock | 372/44 |

OTHER PUBLICATIONS

Wagner et al., "Operating Characteristics of Single-Quantum-Well Al/GaAs/GaAs High-Power Lasers", Quantum Electronics, 24, Jan. 1988, pp. 1258–1265.
Yaeli et al., "Array mode selection utilizing an external cavity configuration", Applied Physics Letters, 47, Jan. 1985, pp. 89–91.
Goldberg et al., "Single lobe operation of a 40-element laser array in an external ring laser cavity", Applied Physics Letters, 51, Jan. 1987, pp. 871–87
Fleming et al., "Spectral Characteristics of External-Cavity Controlled Semiconductor Lasers", Quantum Electronics, QE-17, Jan. 1981, pp. 44–59.
Kogelnick, "Imaging of Optical Modes—Resonators with Internal Lenses" The Bell System Technical Journal, XLIV, Jan. 1965, pp. 455–494.
Wyatt et al., "10 kHz Linewidth 1.5 m InGaAsP External Cavity Laser with 55 nm Tuning Range", Electronics Letters, 19, Jan. 1983, pp. 110–112.
Bachert et al., "Mode deformation due to self-focusing in injection laser and its connection with nonlinearity of the output characteristic", Soviet Journal of Quantum Electronics, 5, Jan. 1978, pp. 346–349.
Harrison et al., "Spectral Linewidth of Semiconductor Lasers", Methods of Laser Spectroscopy, 1985, pp. 133–142.
Arnaud, "Degenerate Optical Cavities", Applied Optics, 8, Jan. 1969, pp. 189–19
Philipp-Rutz, "High-Radiance Room-Temperature GaAs Laser With Controlled Radiation in a Single Transverse Mode", Quantum Electronics, QE-8, Jan. 1972, 632–64
Chang-Hasnain et al., "High power with high efficiency in a narrow single lobed beam from a diode laser array in an external cavity", Applied Physics Letters, 50, Jan. 1987, pp. 1465–1467.
Sharfin et al., "High-power, diffraction-limited, narrow-band, external-cavity diode laser", Applied Physics Letters, 54, Jan. 1989, pp. 1731–1733.

*Primary Examiner*—John D. Lee
*Assistant Examiner*—Robert E. Wise
*Attorney, Agent, or Firm*—Hamilton, Brook, Smith & Reynolds

[57] ABSTRACT

An interchangeable insertable diode laser and lens frame is described in which a pair of lenses is disposed in the frame with a diode laser disposed between the lenses. The laser light from one of the facets is collimated by one of the lenses, such that when the frame is inserted into a housing and coupled to an external cavity in which a diffraction grating is disposed, the grating disperses the light and dispersed light is focused on the facet causing the diode laser to generate single frequency radiation.

32 Claims, 3 Drawing Sheets

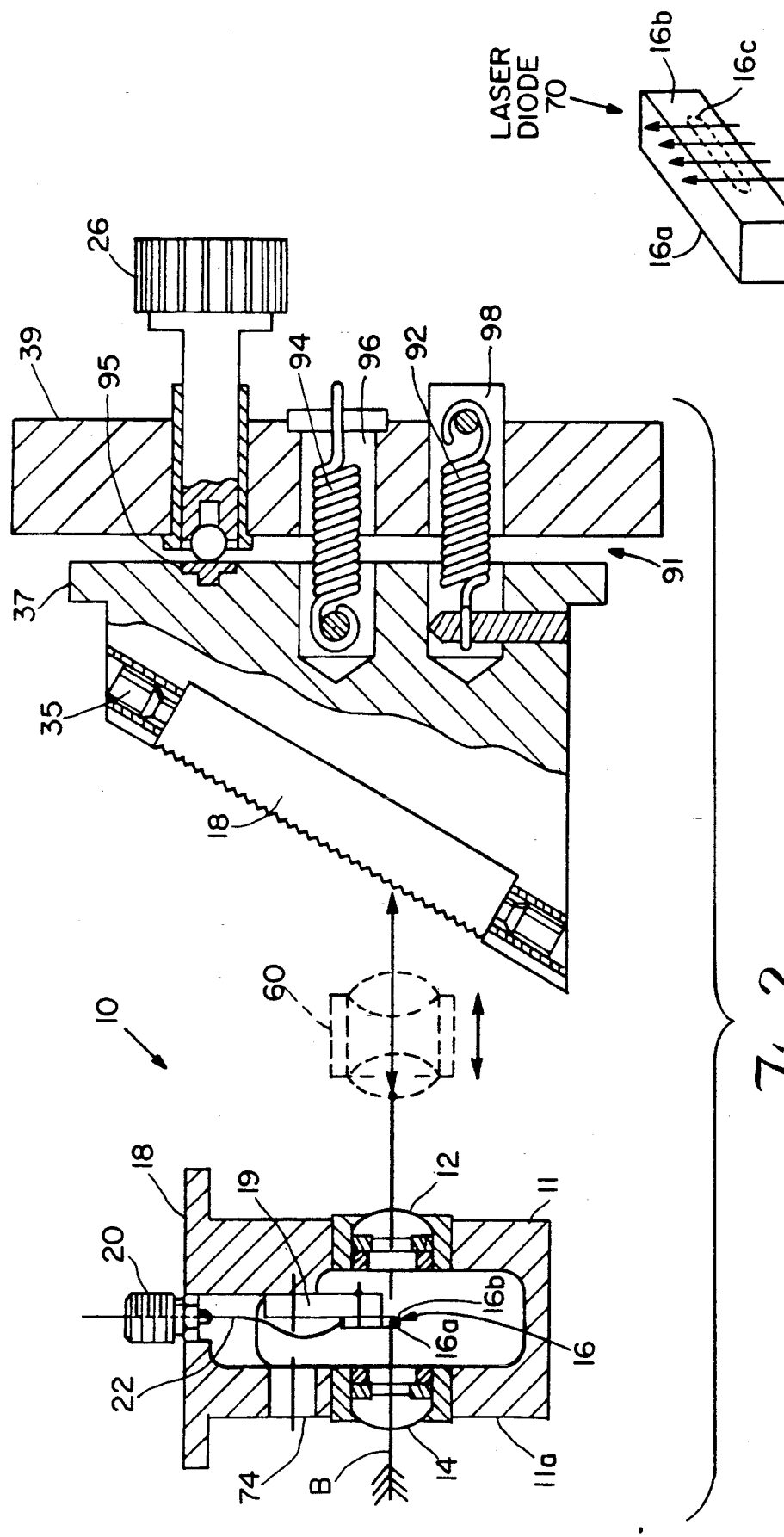

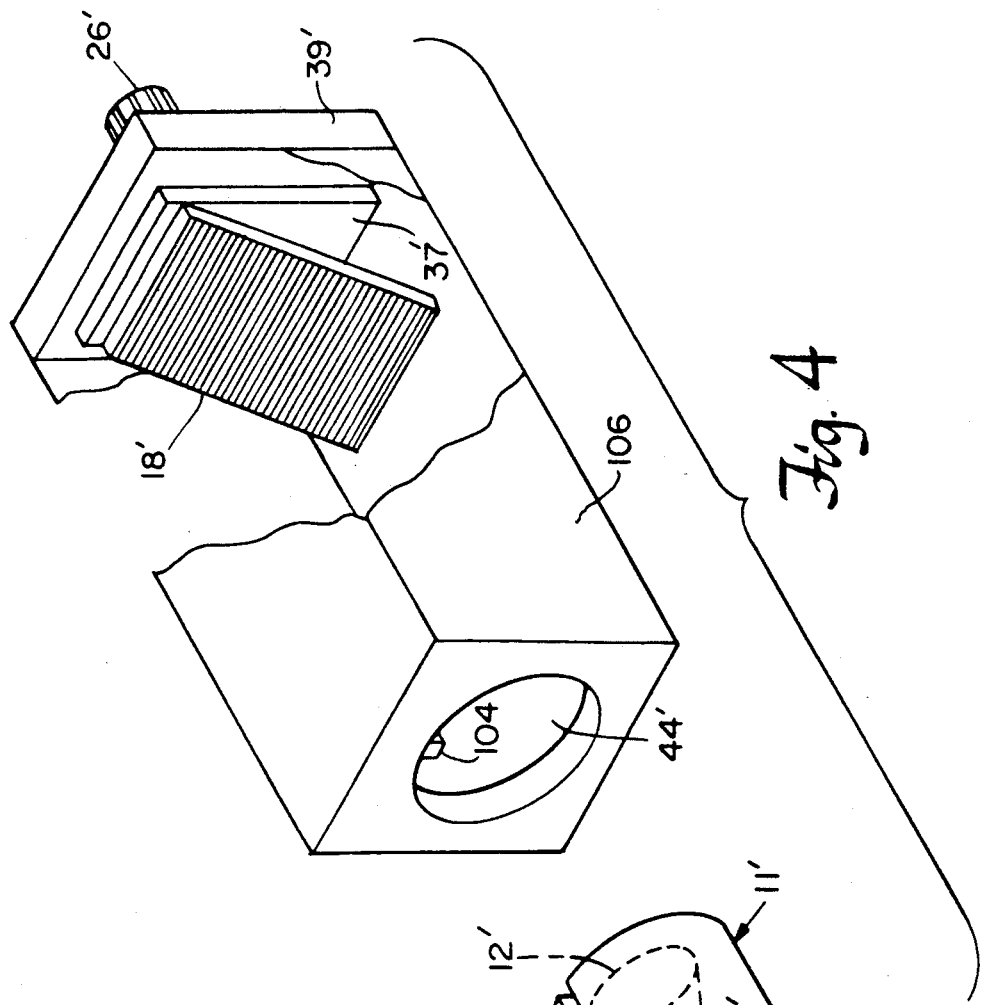
Fig. 4
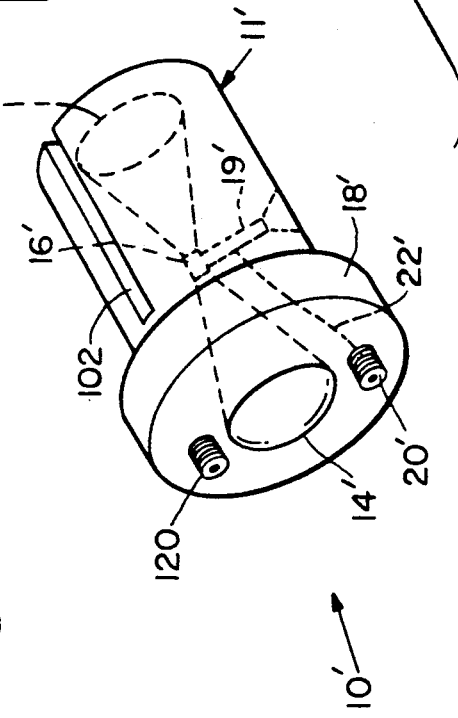
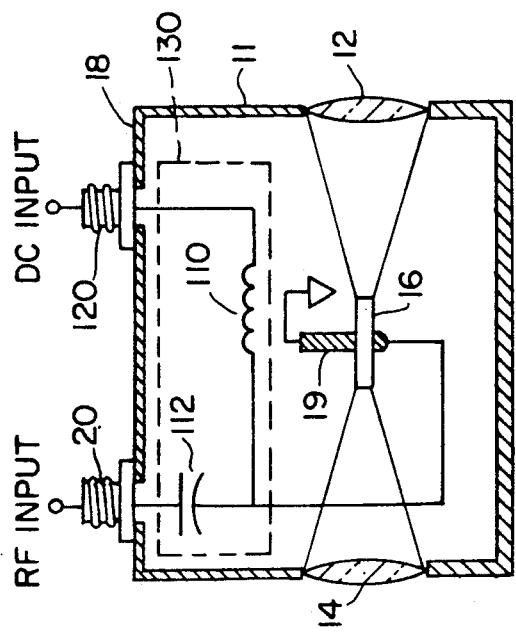
Fig. 5

PRE-ALIGNED DIODE LASER FOR EXTERNAL CAVITY OPERATION

GOVERNMENT FUNDING

The Government has rights in this invention pursuant to Contract Number F19628-85-C-0002 awarded by the Department of the Air Force.

RELATED APPLICATIONS

This is a continuation-in-part of co-pending application U.S. Ser. No. 07/712,185 filed Jun. 7, 1991 which is a continuation of U.S. Ser. No. 07/341,028 filed Apr. 20, 1989, now U.S. Pat. No. 5,050,179.

BACKGROUND OF THE INVENTION

This invention relates generally to lasers and, more specifically, to semiconductor or diode lasers operated in an external cavity.

As noted in the parent application, Ser. No. 07/341,028,now U.S. Pat. No. 5,050,179, numerous advantages accrue to operation of semiconductor lasers in an external cavity as contrasted to solitary diode laser operation. In external cavity-controlled semiconductor lasers, a diode laser with opposed anti-reflective (AR) coated first and second facets is mounted between a pair of AR coated lenses. The facets extend in a plane perpendicular to the plane of the diode gain region extending along the length of the diode laser. One of the lenses collects the laser radiation from the first facet and collimates it onto a frequency tuning element, such as a diffraction grating, where the incident beam is dispersed and reflected colinear with the incident beam and re-imaged onto the first diode facet. Radiation from the second facet is collimated onto an output coupler formed by a dielectric coated, partially reflecting plane mirror.

Selection and tunability of the emission wavelength of the diode laser is achieved by varying the tilt of the diffraction grating to select an appropriate single frequency within the bandwidth of the diode laser to feed back energy to lock the diode laser at the selected frequency. This is in contrast to single diode laser operation which is amenable to reversible frequency control only by externally induced variation of band gap energy and refraction index (through changes in temperature or pressure for example) or by variation of injection current.

Stable, single-mode laser operation in an external cavity necessitates a high degree of thermal and mechanical stability in the cavity. Furthermore, the lens which collimates the laser radiation onto the diffraction grating must be accurately aligned with the facet to avoid mode instabilities. The linear alignment precision requirement is in the order of one wavelength. Alignment is a time-consuming, tedious procedure requiring expensive calibrating equipment. Of necessity, therefore, this alignment process is presently performed by the cavity manufacturer before the cavity is sold to the consumer.

The spectral range of the diffraction grating is in the order of 400 nm, whereas the spectral range of most diodes lasers is only about 50 nm. Therefore, when output wavelengths are required beyond the range of a given diode, as a practical matter, it is usually necessary to purchase another external cavity package with a diode operating in the desired wavelength range to avoid the aforementioned tedious realignment.

BRIEF DESCRIPTION OF THE INVENTION

In accordance with the present invention, diode and lens frame assemblies are provided in which a first facet of the diode laser is pre-aligned with a first of two lenses, i.e., the one which collimates the light onto the tuning element. The frames are easily insertable into an external cavity housing. Each frame assembly is interchangeable with another, except that each diode laser within a given frame assembly is pre-aligned with a lens and covers a different wavelength range of, for example, 40-50 nm, within the spectral range of the tuning element. Each frame assembly consists of a diode lasers supported between a first and second lens. The frame assembly consists of a rigid walled member which extends from a planar support. Opposed sides of the member are provided with a circular opening with an axis which extends parallel to the support plane. The lenses are mounted in these holes with the diode laser disposed between the lenses.

A housing is provided with an opening for receiving the frame assembly. The housing opening is precisely dimensioned, such that the frame securely fits within the opening.

The tuning element is preferably in the form of a diffraction grating which is located opposite the lenses when the frame assembly is inserted in the housing. Other tuning techniques known in the art can also be used, including: tilted etalons, adjustable gap etalons, electro optically (EO) tuned double etalons, and mechanical or EO tuned Lyot filters. The etalon gap spacing may be varied using a piezo-electric crystal.

In one embodiment, the first facet of the diode laser is AR coated and the other facet serves as the output coupler of the external cavity, while the second lens serves as an optical collimator. In an alternate embodiment, both lenses are part of the external cavity and both diode laser facets are AR coated and the second lens forms an output coupler to an output mirror. By AR coating, both facets of the diode, the residual reflectivity is reduced to a minimum and the tuning characteristics and other operating characteristics are controlled (dominated) by the external cavity. This is particularly important for continuous tuning and mode-locked operation.

In either case, light from the grating is focused back on the first facet and the light is dispersed perpendicular to the plane of the gain region of the diode laser. The gain region is usually much wider than its length and the height is typically about 1 micrometer, therefore vertical alignment is not critical. In the azimuthal direction, the grating may be easily aligned by rotation so that the reflected light image falls onto the gain region. Thus, if the original alignment between the diode laser and the collimating lens is precise enough to provide a collimated beam, each frame assembly may be removed and replaced without significant difficulty in re-alignment.

BRIEF DESCRIPTION OF THE DRAWINGS

FIG. 2 is a schematic sectional view of the frame assembly of the system of FIG. 1 shown disposed opposite a diffraction grating.

FIG. 3 is a schematic perspective view of a diode laser.

FIG. 4 is an isometric schematic drawing of an alternate embodiment of the invention.

FIG. 5 is a schematic drawing of another alternate embodiment.

DETAILED DESCRIPTION OF THE INVENTION

Figure 1:
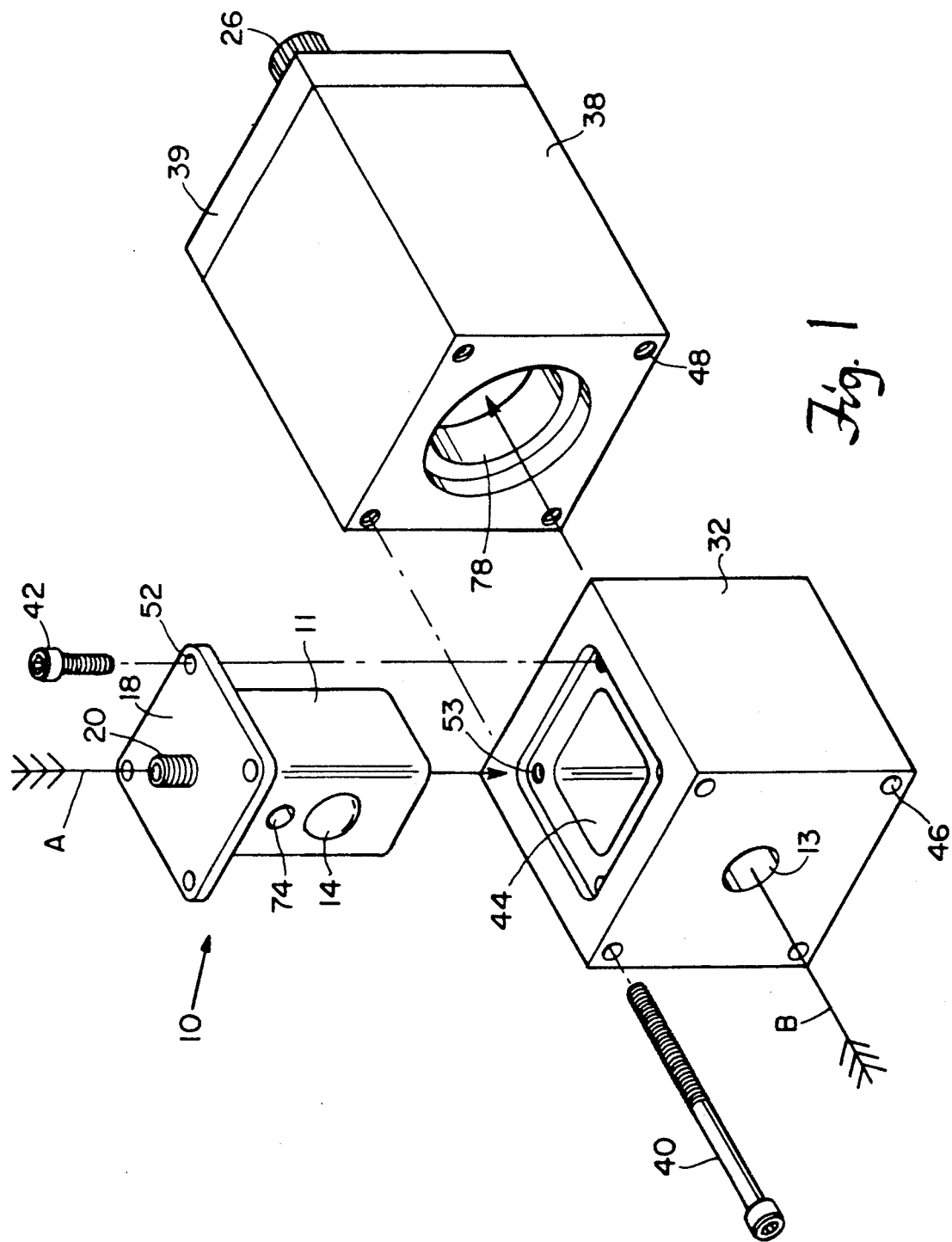
FIG. 1 is an isometric schematic drawing of a first embodiment of an external cavity operated diode laser system.

Referring now to the drawing and FIGS. 1-3, the invention will now be described in detail in connection therewith. An external cavity for a diode laser is shown in FIG. 1 to comprise, in general, a diode and lens frame assembly 10, a frame housing 32 and an extension housing 38.

Frame assembly 10, as shown in FIG. 2, consists of a four-sided frame 11 which extends from a planar support member 18 in a direction transverse the plane of the support.

A coaxial connector 20 is mounted on the planar member 18. Power from a source (not shown) is coupled to a diode laser 16 over wire 22 to provide operating current for the diode laser 16, which is mounted on a copper heat sink 19 fastened to an inner side wall of the frame 11 by fasteners (not shown). An access opening 74 is provided in a side wall 11a to facilitate adjustment of the location of diode laser 16 with respect to the lenses 14 and 12.

A pair of lenses 14 and 12 are disposed in bores provided in opposite side walls 11a and 11b of frame 11. The axis of these bores extends transverse the plane of member 18.

Lenses 14 and 12 may be spherical, cylindrical, aspheric or a combination of both, depending upon the cavity design. The facets 16a and 16b of the diode laser, 16 are placed at the focus of the two lenses, respectively. In the embodiment of FIG. 2, lens 12 is AR coated and forms part of the external cavity, while lens 14 serves as an optical output collimator. Facet 16a of diode 16 serves as the output coupler (with an appropriate reflectivity) for the external cavity, while facet 16b is AR coated.

Housing 32 is provided with a chamber 44 for receiving frame assembly 10, which is inserted into chamber 44 with the lenses 14 and 12 aligned with corresponding opposed openings 13 formed in housing 32. (Note: only one opening 13 can be seen in FIG. 1.)

The chamber 44 is dimensioned such that frame 11 fits within the chamber with negligible clearance and is retained in place by four bolts 42 provided about the periphery of member 18 and extending through bores 52 and 53 in member 18 and housing 32, respectively.

Housing 32 is adapted to mate with a second housing 38 and is secured thereto by four bolts 40 which extend through bores 46 and 48 in housing 32 and 38, respectively. Housing 38 is provided with a circular opening 78 into a cavity in which a diffraction grating 18 is provided. Dispersed diode light 70, reflected from the grating 18, is directed by lens 12 back onto the facet 16b. The grating 18 is positioned with respect to the lens, such that diode light directed by lens 12 is dispersed perpendicular to a plane extending through the plane of the gain region 16c (see FIG. 3).

Optionally, a lens 60 (as shown in dotted lines in FIG. 2), having a focal length longer than lens 12, may be provided between lens 12 and grating 18 to provide a more precise control of the focus on the diode laser facet 16b. Lens 60 is adapted for longitudinal movement along the length of the optical axis B of the cavity. As lens 60 is moved longitudinally along the optical axis, the focus of the light reflected back from grating 18 moves also; thereby providing a more precise focus on the facet than a single lens alone would provide.

Grating 18 is mounted on grating holder 37 by means of set screws 35 located on four sides of the grating. Holder 37 is suspended in two directions from the back plate 39 of housing 38 by means of springs 94 and 92 located in bores 96 and 98 provided in back plate 39 and holder 37 leaving a gap 91 which allows the grating to be tilted in elevation by rotation of screw 26 which bears upon a sapphire bearing pad 95 inserted on the back of holder 37.

Optionally, screw 26 may be coupled by mechanical linkage (not shown) to a computer controlled stepmotor or servo-mechanism for remote control of the output frequency of the diode laser 16.

Preferably, the housing and other structural items of the system are formed of low thermal coefficient of expansion materials, such as, Super Invar metal. As previously noted, other tuning elements may be used in place of grating 18.

An optional quarter wave plate, not shown, may be provided between lens 12 and grating 18 to adjust the polarization of light falling on grating 18 to obtain maximum reflectivity from grating 18.

Referring now to FIG. 4, an alternate embodiment of the external cavity controlled semiconductor laser system of the invention will now be described in connection therewith. Note that like parts in FIG. 4 retain the same numeral as in FIG. 1 with a prime added thereto. In this embodiment the frame 10' is cylindrical in shape and is formed with a circular cover plate 18'. Cylindrical wall 11' extends longitudinally from cover plate 18'. A diode laser 16' (shown in dotted lines) is mounted on heat sink 19' and is supported within a bore provided in the cylindrical wall 11'. Lenses 14' and 12' are coaxially aligned and mounted on opposite ends of frame 10' and focussed on opposite facets of diode laser 16'. A coaxial connector 20' is coupled by lead 22' to diode laser 16' for supplying power to the laser.

A slot or groove 102 extends along the length of cylindrical wall 11' and is adapted to mate with a corresponding tongue 104 on an inner wall of a circular opening 44' formed in external cavity housing 106. Housing 106 contains a diffraction grating 18' which is tiltably mounted on holder 37' adjacent back plate 39' as in FIG. 2.

In the embodiment of FIG. 4, interchangeable frame structures 10' with pre-aligned lenses and diode laser covering different frequency ranges may be conveniently inserted into housing 106 by sliding the cylindrical wall along tongue or guide rail 104 and aligned with tuning element 18'. Once inserted the frame is affixed by removable pins or other equivalent fastening techniques (not shown).

The frame assembly 10 may be provided with an additional coaxial connector 120 as shown in FIG. 4 and FIG. 5 for coupling DC voltage to diode laser 16 in addition to, or as an alternative to, the RF voltage supplied via coaxial connector 20. Note that like items in FIGS. 5 and 2 contain the same reference numeral. The RF voltage supplied at the input to connector 20 is coupled to one side of capacitor 112 of bias-Tee 130 and passes through the capacitor to mode-lock or provide high speed pulsing for laser 16. A DC bias voltage may also be applied to diode 16 via connector 120 and is coupled through inductor 110 to either provide a DC threshold voltage for pulsed operation of laser 16 by the RF voltage on connector 20 or for CW operation absent RF voltage on connector 20.

EQUIVALENTS

Those skilled in the art will recognize, or be able to ascertain, using no more than routing experimentation, many equivalents to the specific embodiments of the invention described herein.

These and all other equivalents are intended to be encompassed by the following claims.

I claim:

1. A diode laser and lens frame assembly adapted for insertion into an external cavity housing, comprising:
   a) a frame formed of a support member and a walled member extending therefrom with first and second opposed openings formed in the member;
   b) a diode laser having first and second facets mounted between said openings;
   c) a lens mounted in the first of said openings and focused on said first facet.

2. The frame assembly of claim 1 wherein a lens is mounted in the second opening and is focused on the second facet.

3. The assembly of claim 2 wherein the first lens is antireflection coated.

4. The frame assembly of claim 1 including an electrical connector on said support member for coupling electrical power to said diode.

5. The assembly of claim 1 wherein the support member extends in a plane and the walled member extends transverse said plane.

6. The assembly of claim 5 wherein the walled member is cylindrical.

7. The assembly of claim 6 wherein the walled member is slotted to mate with a guide rail on said housing.

8. The assembly of claim 5 wherein the walled member is rectangular and has at least two side walls and the openings are formed in the side walls.

9. The assembly of claim 1 wherein two electrical connectors are provided on the support member for coupling AC or DC electrical power to the diode.

10. The assembly of claim 9 including a bias tee coupled between the diode and connectors for separating the AC power from the DC power applied to the diode.

11. An external cavity system for a diode laser comprising:
    a) a diode laser and lens frame assembly for insertion into an external cavity housing; comprising;
       i) a frame formed of a support member and a walled member extending therefrom with opposed openings formed in said walled member;
       ii) a diode laser with opposed facets mounted between said openings; and
       iii) a lens provided in one of said openings and focused on one of said facets;
    b) a housing with an opening therein for receiving said walled member; and
    c) a tuning element disposed within said housing for receiving light from said diode laser and causing the frequency of said light to become substantially single frequency light within the frequency range of the diode laser.

12. The system of claim 11 wherein the tuning element is a diffraction grating.

13. The system of claim 11 wherein a second lens is provided in the remaining opening and is focused upon the remaining facet.

14. The system of claim 13 wherein the walled member is cylindrical.

15. An external cavity system for a diode laser, comprising:
    a) a diode laser and lens frame assembly for insertion into a first housing, comprising:
       i) a support member extending in a first plane with a walled member extending transverse the plane and openings in said member having an axis extending along said first plane;
       ii) first and second lenses mounted in a respective opening;
       iii) a diode laser mounted between said lenses and having first and second facets extending transverse the first plane; and wherein the first lens is focused on the first facet and collimates light therefrom;
    b) a housing with a chamber for receiving said frame assembly; and
    c) a tuning element disposed in the housing, such that when the frame assembly is affixed within the chamber of the housing, light from the first facet of the diode laser is collimated by said first lens and is reflected back upon said first facet from said tuning element thereby causing the diode laser to emit substantially single frequency light within the frequency range of the diode laser.

16. The system of claim 15 including multiple interchangeable frame assemblies with different diode lasers capable of emitting light within a predetermined narrow bandwidth within a broad bandwidth of said tuning element.

17. The system of claim 15 wherein the first lens and second lens are AR coated.

18. The system of claim 15 wherein a third lens is provided between the first lens and the tuning element for longitudinal movement along an optical axis of the system.

19. The system of claim 15 wherein the lenses are taken from the group comprising spherical, cylindrical, or aspherical.

20. A diode laser and lens frame assembly comprising:
    a) a rigid frame formed of a planar support member with a walled member extending from the support in a first direction transverse the plane of the support member and openings in the member having axis extending transverse the first direction;
    b) an electrical connector mounted on the frame;
    c) a pair of lenses, one each mounted opposite said openings;
    d) a diode laser coupled to said connector and having first and second opposed facets disposed within said frame between said lenses and aligned with said lenses, such that light from said first facet is collimated by one of said lenses.

21. A diode laser and lens frame assembly adapted for insertion into an external cavity housing, comprising:
    a) a frame formed of a support member extending in a plane and having opposed side walls extending transverse the plane with first and second openings formed in the opposed walls, said openings having an axis extending along said plane;
    b) a diode laser having first and second facets mounted between said openings;

c) a collimating lens mounted in the first of said openings and focused on said first facet.

22. The frame assembly of claim 21 wherein a lens is mounted in the second opening and is focused on the second facet.

23. The frame assembly of claim 21 including an electrical connector on said support member for coupling electrical power to said diode.

24. The assembly of claim 21 wherein the first lens is antireflection coated.

25. An external cavity system for diode laser, comprising:
 a) a diode laser and lens frame assembly for insertion into a first housing, comprising:
  i) a support member extending in a first plane with opposed side walls extending transverse the plane and openings in said side walls having an axis extending along said plane;
  ii) first and second lenses mounted in a respective opening;
  iii) a diode laser mounted between said lenses and having first and second facets extending transverse the first plane; and wherein the first lens is focused on the first facet and collimates light therefrom;
 b) a first housing with a chamber for receiving said frame assembly, said housing having openings with axis extending in the first plane, said openings located opposite said lenses when the frame assembly is affixed within the chamber;
 c) a second housing adapted to be affixed to said first housing, said second housing having a cavity in which a diffraction grating is disposed opposite an opening in the second housing, such that when the frame assembly is affixed within the chamber of the first housing and the housings are affixed to each other, light from the first facet of the diode laser is collimated by said first lens and is dispersed by said grating and the dispersed light is reflected back upon said first facet; thereby causing the diode laser to emit substantially single frequency light within the frequency range of the dispersed light from the grating.

26. The system of claim 25 including multiple interchangeable frame assemblies with different diode lasers capable of emitting light within a predetermined bandwidth within a broad bandwidth of said grating.

27. The system of claim 25 wherein the first lens and second lens are AR coated.

28. The system of claim 25 wherein a third lends is provided between the first lens and the grating and is adapted for longitudinal movement along an optical axis of the system.

29. The system of claim 25 wherein the lenses are taken from the group comprising spherical, cylindrical, or a spherical.

30. A diode laser and lens frame assembly comprising:
 a) a rigid frame formed of a planar support member with at least a pair of opposed side walls extending from the support in a first direction transverse the plane of the support member and openings in said side walls having axis extending transverse the first direction;
 b) an electrical connector mounted on the frame;
 c) a pair of lenses, one each mounted opposite said openings;
 d) a diode laser coupled to said connector and having first and second opposed facets disposed within said frame between said side walls and aligned with said lenses, such the light from said first facet is collimated by one of said lenses.

31. An external cavity system for a diode laser, comprising:
 a) a diode laser and lens frame assembly for insertion into a first housing, comprising:
  (i) a support member extending in a first plane with opposed side walls extending transverse the plane and openings in said side walls having an axis extending along said plane;
  (ii) first and second lenses mounted in a respective opening;
  (iii) a diode laser mounted between said lenses and having first and second facets extending transverse the first plane; and wherein the first lens is focused on the first facet and collimates light therefrom;
 b) a housing comprising a first section with a chamber for receiving said frame assembly, said section having openings with axis extending in the first plane, said openings located opposite said lenses when the frame assembly is affixed within the chamber and a second section having a cavity in which a tuning element is disposed opposite an opening in the second section, such that when the frame assembly is affixed within the chamber of the first section, light from the first facet of the diode laser is collimated by said first lens upon said tuning element and is reflected back upon said first facet; thereby causing the diode laser to emit substantially single frequency light within the frequency range of the tuning element.

32. A method of forming a diode laser external cavity, comprising the steps of:
 a) forming an interchangeable frame having a prealigned lens focused upon a diode laser having a facet lying in a plane for collimating light from the facet;
 b) inserting the frame in the cavity of a housing containing a diffraction grating mounted such that light from the facet is collimated on the grating and dispersed and the dispersed light is focused on said facet in a plane parallel to the plane of the facet.

* * * * *